United States Patent
Mack et al.

(10) Patent No.: US 6,646,277 B2
(45) Date of Patent: Nov. 11, 2003

(54) CHARGING CONTROL AND DOSIMETRY SYSTEM FOR GAS CLUSTER ION BEAM

(75) Inventors: Michael E. Mack, Manchester, MA (US); Bruce K. Libby, Groveland, MA (US)

(73) Assignee: Epion Corporation, Billerica, MA (US)

(*) Notice: Subject to any disclaimer, the term of this patent is extended or adjusted under 35 U.S.C. 154(b) by 0 days.

(21) Appl. No.: 10/036,179

(22) Filed: Dec. 26, 2001

(65) Prior Publication Data

US 2002/0130275 A1 Sep. 19, 2002

Related U.S. Application Data (60) Provisional application No. 60/258,280, filed on Dec. 26, 2000.

(51) Int. Cl.[7] .......................... G01N 23/00; G21G 5/00; H01J 37/08; C23C 14/00
(52) U.S. Cl. .............................. 250/492.21; 250/492.1; 250/492.2; 250/492.23; 250/492.3; 204/192.3; 204/192.34
(58) Field of Search .......................... 250/491.1, 492.1, 250/492.2, 492.23, 492.21, 492.3, 396 R, 397, 398, 400, 423 R, 424; 204/192, 192.1, 192.11, 192.3, 192.34

(56) References Cited

U.S. PATENT DOCUMENTS

| | | | | |
|---|---|---|---|---|
| 4,021,675 A | | 5/1977 | Shifrin ....................... 250/492 |
| 4,361,762 A | | 11/1982 | Douglas ..................... 250/251 |
| 4,641,034 A | * | 2/1987 | Okamura et al. ........... 250/398 |
| 4,816,693 A | * | 3/1989 | Rathmell .................... 250/397 |
| 5,164,596 A | | 11/1992 | Noguchi et al. ............ 250/309 |
| 5,319,212 A | * | 6/1994 | Tokoro ........................ 250/397 |
| 5,329,129 A | * | 7/1994 | Shono et al. ............. 250/492.1 |
| 5,459,326 A | * | 10/1995 | Yamada ...................... 250/398 |
| 5,466,929 A | * | 11/1995 | Sakai et al. ................. 250/251 |
| 5,572,038 A | * | 11/1996 | Sheng et al. ................ 250/397 |
| 5,668,368 A | * | 9/1997 | Sakai et al. ................. 250/251 |
| 5,760,409 A | * | 6/1998 | Chen et al. ............ 250/492.21 |
| 5,814,194 A | * | 9/1998 | Deguchi et al. ......... 204/192.1 |
| 6,331,227 B1 | * | 12/2001 | Dykstra et al. ....... 118/723 CB |
| 2002/0005676 A1 | * | 1/2002 | Greer ......................... 310/312 |
| 2002/0014407 A1 | * | 2/2002 | Allen et al. ............ 204/298.36 |
| 2002/0017454 A1 | * | 2/2002 | Kirkpatrick ............ 204/192.34 |
| 2002/0017455 A1 | * | 2/2002 | Kirkpatrick et al. ... 204/192.34 |
| 2002/0109106 A1 | * | 8/2002 | Berrian et al. ......... 250/492.21 |

OTHER PUBLICATIONS

"Cluster Ion Beam Processing", *Materials Science in Semiconductor Processing;* vol. 1, 1998, pp. 27–41, Yamada & Matsuo.

"Surface Processing by Gas Cluster Ion Beams at the Atomic (molecular) Level", *J. Vac. Sci. Technol.,* Yamada et al., vol. A 14, No. 3, May 1996, pp. 781–785.

* cited by examiner

*Primary Examiner*—John R. Lee
*Assistant Examiner*—Bernard E. Souw
(74) *Attorney, Agent, or Firm*—Perkins, Smith & Cohen; Jerry Cohen (57) ABSTRACT

A method and apparatus for gas cluster ion beam (GCIB) processing uses X-Y scanning of the workpiece relative to the GCIB. A neutralizer reduces surface charging of the workpiece by the GCIB. A single Faraday cup sensor is used to measure the GCIB current for dosimetry and scanning control and also to measure and control the degree of surface charging that may be induced in the workpiece during processing.

13 Claims, 6 Drawing Sheets

CHARGING CONTROL AND DOSIMETRY SYSTEM FOR GAS CLUSTER ION BEAM

CROSS REFERENCE TO RELATED APPLICATIONS

This applications claims priority of U.S. Provisional Application Ser. No. 60/258,280 filed Dec. 26, 2000, entitled CHARGING CONTROL AND DOSIMETRY SYSTEM FOR GAS CLUSTER ION BEAM which incorporated herein by reference.

BACKGROUND OF THE INVENTION

This invention relates generally to dosimetry and workpiece neutralization for ion beam processing of workpieces, and, more particularly to dosimetry and workpiece neutralization for gas cluster ion beam (GCIB) processing.

The use of a GCIB for etching, cleaning, and smoothing of the surfaces of various materials is known in the art (See for example, U.S. Pat. No. 5,814,194, Deguchi, et al., "Substrate Surface Treatment Method", 1998). Means for creation of and acceleration of such GCIBs are also described in the Deguchi reference. It is also known (U.S. Pat. No. 5,459,326, Yamada, "Method for Surface Treatment with Extra-Low-Speed Ion Beam", 1995) that atoms in a cluster ion are not individually energetic enough (on the order of a few electron volts) to significantly penetrate a surface to cause the residual sub-surface damage typically associated with the other types of ion beam processing in which individual ions may have energies on the order of thousands of electron volts. Nevertheless, the cluster ions themselves can be made sufficiently energetic (some thousands of electron volts), to effectively etch, smooth or clean surfaces as shown by Yamada & Matsuo (in "Cluster ion beam processing", Matl. Science in Semiconductor Processing I, (1998) pp 27–41).

Since GCIBs contain ionized particles that carry electrical charge, a measure of the processing dose a workpiece receives is the amount of charge (amp-seconds) received by a unit area of the workpiece, measured in amp-seconds per square centimeter, for example. For insulating, partly insulating, or semiconductive workpieces, ion beam processing can induce charging of the workpiece undergoing ion beam processing. An advantage of GCIB processing over some more conventional ion beam processes is that, because of the relatively large mass to charge ratio of the cluster ions compared to conventional atomic or molecular ions, processing can often be effected with less transfer of charge to the workpiece. Nevertheless, workpiece charging is still a concern and means are needed to reduce the degree of such charging during GCIB processing of workpieces.

It is therefore an object of this invention to provide apparatus and methods for measuring and controlling the processing dose received by a workpiece.

It is a further object of this invention to measure and control the amount of charge or surface charging that is or may be received by a workpiece during GCIB processing.

SUMMARY OF THE INVENTION

The objects set forth above as well as further and other objects and advantages of the present invention are achieved by the embodiments of the invention described hereinbelow.

A gas cluster ion beam processing apparatus treats a workpiece with a gas cluster ion beam to effect surface modification such as smoothing, etching, cleaning, deposition, etc. A neutralizer is provided to reduce surface charging of the workpiece by the GCIB. A single Faraday cup sensor is used to measure the GCIB current for dosimetry and scanning uniformity control and also to measure and control the degree of surface charging that may be induced in the workpiece during processing.

To insure uniform processing, X-Y mechanical scanning of the workpiece relative to the GCIB is used to distribute the beam effects over the surface or the workpiece. The mechanical scanning mechanism moves the workpiece in an orthogonal raster pattern through the GCIB and also out of the beam at least once each processing cycle. At that time, the GCIB current is measured by an electron suppressed Faraday cup. However, with an improved switching and control technique, the Faraday cup can also be used to measure the total current for workpiece charging and, thus, may control a charge neutralization system or provide a display and an alarm and/or interlock to indicate an undesirable workpiece charging condition. To provide this charging current sensing feature, the suppression voltage on the Faraday cup bias ring is removed. This allows electrons as well as gas cluster ions to be sensed by the Faraday cup. Measurement of the charging can then be accomplished by measuring the net current in the Faraday cup.

For a better understanding of the present invention, together with other and further objects thereof, reference is made to the accompanying drawings and detailed description and its scope will be pointed out in the appended claims.

DETAILED DESCRIPTION OF THE PREFERRED EMBODIMENTS

Figure 1:
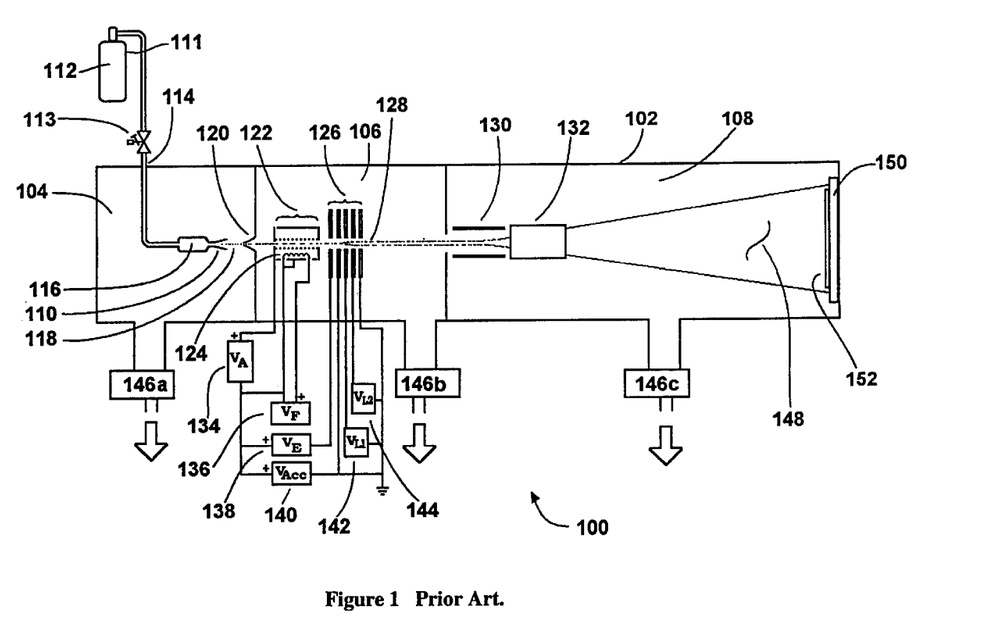
FIG. 1 is a schematic showing the basic elements of a prior art GCIB processing apparatus that uses an electrostatically scanned beam.

FIG. 1 shows a schematic of the basic elements of a typical configuration for a GCIB processor 100 of a form known in prior art, and which may be described as follows: a vacuum vessel 102 is divided into three communicating chambers, a source chamber 104, an ionization/acceleration chamber 106, and a processing chamber 108. The three chambers are evacuated to suitable operating pressures by vacuum pumping systems 146a, 146b, and 146c, respectively. A condensable source gas 112 (for example argon or $N_2$) stored in a gas storage cylinder 111 is admitted under pressure through gas metering valve 113 and gas feed tube 114 into stagnation chamber 116 and is ejected into the substantially lower pressure vacuum through a properly shaped nozzle 110. A supersonic gas jet 118 results. Cooling, which results from the expansion in the jet, causes a portion of the gas jet 118 to condense into clusters, each consisting of from several to several thousand weakly bound atoms or molecules. A gas skimmer aperture 120 partially separates the gas molecules that have not condensed into a cluster jet from the cluster jet so as to minimize pressure in the downstream regions where such higher pressures would be detrimental (e.g., ionizer 122, high voltage electrodes 126, and process chamber 108). Suitable condensable source gases 112 include, but are not necessarily limited to argon, nitrogen, carbon dioxide, oxygen, and other gases.

After the supersonic gas jet 118 containing gas clusters has been formed, the clusters are ionized in an ionizer 122. The ionizer 122 is typically an electron impact ionizer that produces thermoelectrons from one or more incandescent filaments 124 and accelerates and directs the electrons causing them to collide with the gas clusters in the gas jet 118, where the jet passes through the ionizer 122. The electron impact ejects electrons from the clusters, causing a portion the clusters to become positively ionized. A set of suitably biased high voltage electrodes 126 extracts the cluster ions from the ionizer, forming a beam, then accelerates them to a desired energy (typically from 1 keV to several tens of keV) and focuses them to form a GCIB 128. Filament power supply 136 provides voltage $V_F$ to heat the ionizer filament 124. Anode power supply 134 provides voltage $V_A$ to accelerate thermoelectrons emitted from filament 124 to cause them to irradiate the cluster containing gas jet 118 to produce ions. Extraction power supply 138 provides voltage $V_E$ to bias a high voltage electrode to extract ions from the ionizing region of ionizer 122 and to form a GCIB 128. Accelerator power supply 140 provides voltage $V_{Acc}$ to bias a high voltage electrode with respect to the ionizer 122 so as to result in a total GCIB acceleration energy equal to $V_{Acc}$ electron volts (eV). One or more lens power supplies (142 and 144 shown for example) may be provided to bias high voltage electrodes with potentials ($V_{L1}$ and $V_{L2}$ for example) to focus the GCIB 128.

A workpiece 152, which may be a semiconductor wafer or other workpiece to be processed by GCIB processing, is held on a workpiece holder 150, disposed in the path of the GCIB 128. Since most applications contemplate the processing of large workpieces with spatially uniform results, a scanning system is desirable to uniformly scan the GCIB 128 across large areas to produce spatially homogeneous results. Two pairs of orthogonally oriented electrostatic scan plates 130 and 132 can be utilized to produce a raster or other scanning pattern across the desired processing area. When beam scanning is performed, the GCIB 128 is converted into a scanned GCIB 148, which scans the entire surface of workpiece 152.

Figure 2:
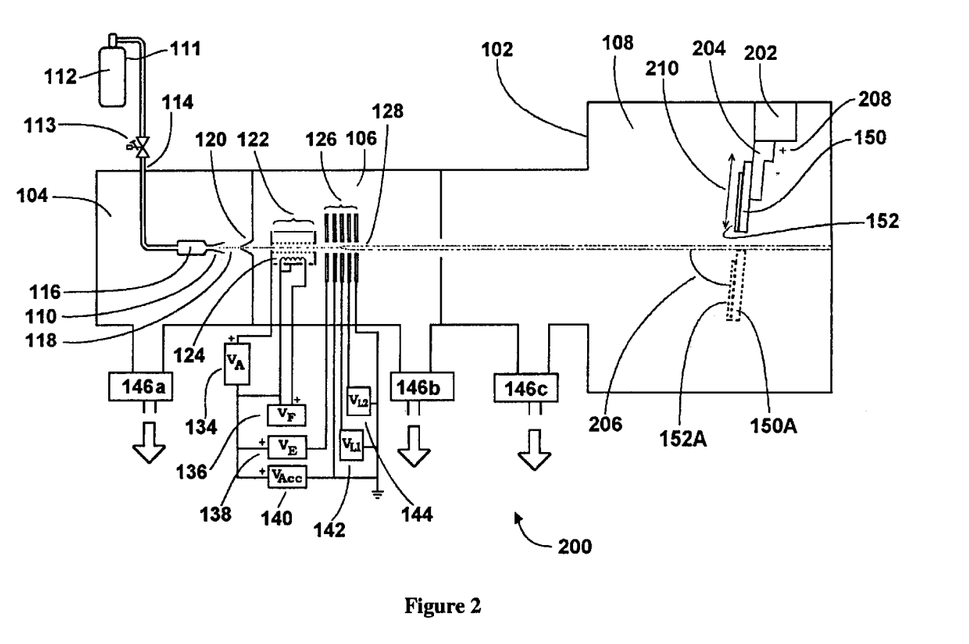
FIG. 2 is a schematic showing the basic elements of a GCIB processing apparatus of the present invention that uses mechanical scanning of a workpiece to distribute the effect of a GCIB over a surface of a workpiece.

FIG. 2 shows a schematic of the basic elements of an improved configuration for a mechanical scanning GCIB processor 200, which uses a mechanical scanning technique to scan the workpiece relative to the GCIB. GCIB formation is essentially as shown in FIG. 1, but in mechanical scanning GCIB processor 200 of FIG. 2, the GCIB 128 is stationary (not scanned) and the workpiece 152 is mechanically scanned through the GCIB 128 to distribute the effects of the GCIB 128 over a surface of the workpiece 152. An X-scan actuator 202 provides linear motion of the workpiece holder 150 in the direction of X-scan motion 208 (into and out of the plane of the paper). A Y-scan actuator 204 provides linear motion of the workpiece holder 150 in the direction of Y-scan motion 210, which is orthogonal to the X-scan motion 208. The combination of X-scanning and Y-scanning motions moves the workpiece 152, held by the workpiece holder 150 in a raster-like scanning motion through GCIB 128 to cause a uniform irradiation of a surface of the workpiece 152 by the GCIB 128 for uniform processing of the workpiece 152. The workpiece holder 150 disposes the workpiece at an angle with respect to the axis of the GCIB 128 so that the GCIB 128 has an angle of beam incidence 206 with respect to the workpiece 152 surface. The angle of beam incidence 206 may be 90 degrees or some other angle, preferably 90 degrees or near 90 degrees. During Y-scanning, the workpiece 152 held by workpiece holder 150 moves from the position shown to the alternate position "A", indicated by the designators 152A and 150A respectively. Notice that in moving between the two positions, the workpiece 152 is scanned through the GCIB 128 and in both extreme positions, is moved completely out of the path of the GCIB 128 (over-scanned). Though not shown explicitly in FIG. 2, similar scanning and over-scan is performed in the orthogonal X-scan motion 208 direction (in and out of the plane of the paper) as will be discussed later in discussion of FIG. 4B.

Figure 3:
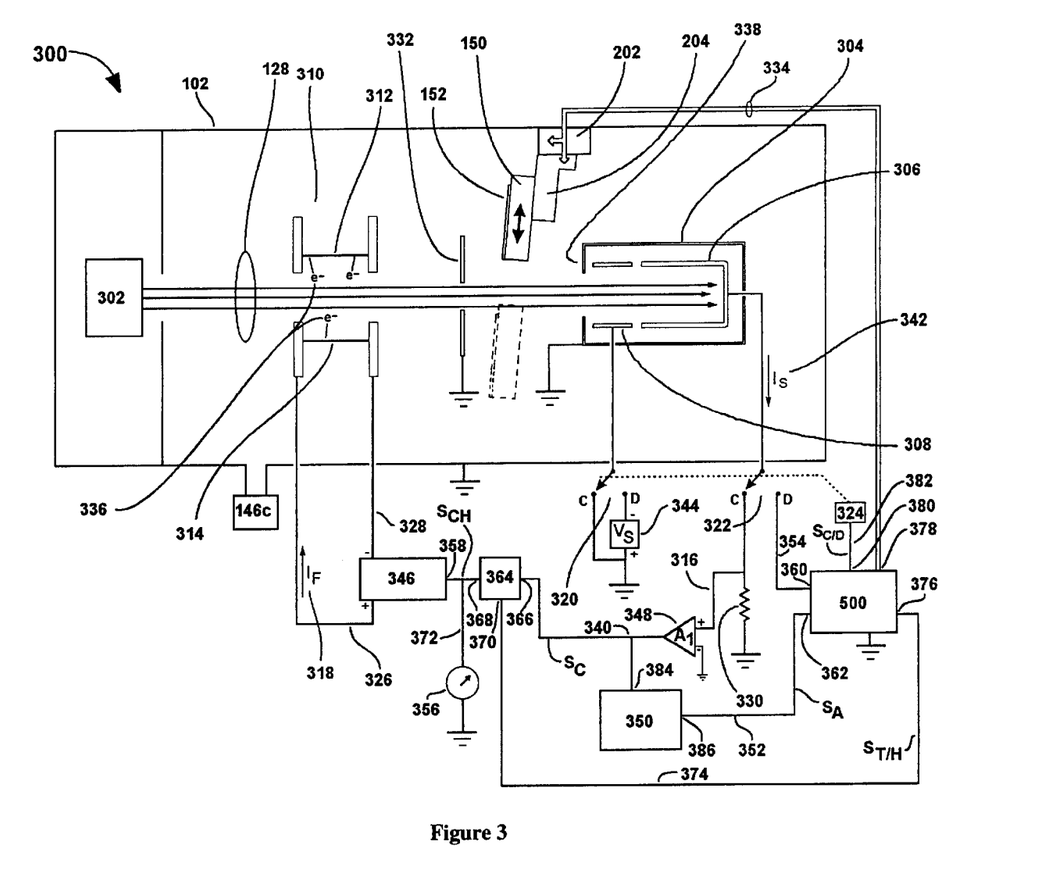
FIG. 3 is a schematic of a GCIB processing system having charging control and dose measurement and control improvements of the present invention.

FIG. 3 shows the improved GCIB processing system 300 of the present invention. A GCIB generating system 302 is summarized schematically as a block. The GCIB generating system 302 can be any of a variety of sources of GCIB having functionality similar to that of the components shown in the source chamber 104 and in the ionizing/acceleration chamber 106 of the mechanical scanning GCIB processor 200 of FIG. 2. Referring again to FIG. 3, GCIB 128 is generated by GCIB generating system 302. The workpiece 152, workpiece holder 150, X-scan actuator 202 and Y-scan actuator 204 are all disposed and function as described for the mechanical scanning GCIB processor 200 of FIG. 2. A neutralizer 310 disposes one or more thermionic filaments (two shown for example, not for limitation, as first filament 312 and second filament 314, disposed radially about and parallel to the GCIB 128) near the path of the GCIB 128. Although the neutralizer 310 has been shown as a thermionic neutralizer for example, it is recognized that other types of neutralizers may be used as part of the present invention, provided that the neutralizer be controllable to increase or decrease the electron output for neutralization. Such alternate neutralizers known in the ion beam art include, but are not limited to, an accel-decel electron guns and various plasma devices such as a plasma electron flood. In the present example of a thermionic neutralizer 310, a controllable neutralizer power supply 346 having a control signal input 358 provides controllable filament current 318 symbolized by $I_F$ for heating the filaments 312 and 314 through leads 326 and 328. Some thermoelectrons 336 emitted by the heated thermionic filaments 312 and 314 are attracted to the positive space charge of the positively charged GCIB 128 and flow along the GCIB 128, reducing the space charge of GCIB 128 and providing a source of electrons to the workpiece 152 to reduce positive charging thereof by the GCIB 128, by neutralizing positive charges that could otherwise accumulate on the workpiece 152. A GCIB defining aperture 332 defines GCIB 128 to limit the extent of GCIB 128 downstream of the GCIB defining aperture 332 to assure that the entire extent of GCIB 128 can pass through GCIB sensor aperture 338 into a Faraday cup 306. Faraday cup 306 has a suppression electrode 308 and a grounded enclosure 304 and is disposed in the path of GCIB 128 downstream of the GCIB defining aperture 332 and the GCIB sensor aperture 338 so as to collect sensor current 342, symbolized as $I_S$, for measurement.

A first single-pole double-throw switch 322 having a charging measurement position identified "C" and having a dosimetry measurement position identified "D" controllably connects sensor current 342 to either of resistor 330 via lead 316, or through lead 354 to sensing input 360 of dosimetry and scanner control system 500. Resistor 330 may have a value of, for example, 1 Megohm.

A second single-pole double-throw switch 320 having a charging measurement position identified "C" and having a dosimetry measurement position identified "D" controllably connects suppression electrode 308 to suppression power supply 344 or to ground.

Switches 320 and 322 are ganged and together controlled by switch controller 324 for simultaneous actuation. Switches 320 and 322 are either both switched to position "C" or both switched to position "D".

When dosimetry measurement is required, switches 320 and 322 are both switched to position "D". Hence sensor current 342 ($I_S$) is connected to dosimetry and scanner control system 500 and suppression electrode 308 is connected to suppression power supply 344 and thereby biased negative with an electrical potential, suppressor voltage $V_S$, which may be 1500 volts, for example. When suppression electrode 308 is biased negative, it prevents entry of or exit of electrons to/from the Faraday cup 306 and sensor current 342 ($I_S$) is a measure of the GCIB current.

When measurement of approximate workpiece charging current is required, switches 320 and 322 are both switched to position "C". Hence sensor current 342 ($I_S$) is connected through lead 316 to resistor 330 as well as to the non-inverting input of amplifier 348; also suppression electrode 308 is connected to ground and is without bias. When suppression electrode 308 is unbiased, it permits entry or exit of electrons to/from the Faraday cup 306 and sensor current 342 ($I_S$) is a measure of the GCIB current plus electron currents flowing into and out of the Faraday cup 306. This sum of GCIB and electron currents approximates the total current available for charging a workpiece. Amplifier 348 has a high input-impedance non-inverting input and amplifies the voltage drop across resistor 330 due to sensor current 342 ($I_S$) flowing to ground through resistor 330. Amplifier 348 has a gain $A_1$ and outputs charging signal $S_C$ proportional to the available workpiece charging current. Lead 340 connects charging signal $S_C$ to the charging signal input 384 of charge alarm system 350 and to the sample signal input 366 of track-hold module 364. Charge alarm system 350 has an alarm output 386 and produces an alarm signal $S_A$ at alarm output 386 if the magnitude of $S_C$ exceeds a preset value previously experimentally determined to be detrimental to the workpiece 152. Lead 352 connects alarm signal $S_A$ from alarm output 386 of charge alarm system 350 to alarm signal input 362 of dosimetry and scanner control system 500. The charge alarm system 350 may optionally also produce audible and/or visual alarm indications when it produces an alarm signal $S_A$, to notify a human equipment operator that a possible workpiece charging condition exists. Track-hold module 364 has a track/hold command input 370 for receiving a track/hold signal $S_{T/H}$ through lead 374 from track hold command output 376 of dosimetry and scanner control system 500 to cause track-hold module 364 to controllably track or hold the signal $S_C$. The tracked or held value of signal $S_C$ is output as charging track/hold signal $S_{CH}$, at the track/hold output 368 of track-hold module 364. Lead 372 connects charging track/hold signal $S_{CH}$ to control input 358 of neutralizer power supply 346 and to indicator device 356. Responsive to an increase in signal $S_{CH}$ at control input 358, neutralizer power supply 346, produces increasing filament current 318 ($I_F$) in thermionic filaments 312 and 314, resulting in increased thermionic emission of thermoelectrons 336, with corresponding increasing availability of electrons to neutralize GCIB 128 space charge and to reduce the net current available for workpiece charging. Indicator device 356 displays an indication of the magnitude of charging track/hold signal $S_{CH}$, which is an indication of current available for charging workpiece 152. Dosimetry and scanner control system 500 has scanner control outputs 378 for outputting scanner control signals on cable 334 to control the X-scan actuator 202 and the Y-scan actuator 204. Dosimetry and scanner control system 500 also has a switch control output 380 for outputting a C/D switch control signal, $S_{C/D}$, through lead 382 to switch controller 324. The functionality of dosimetry and scanner control system 500 is explained hereinafter during the discussion of FIG. 5.

Figure 4A:
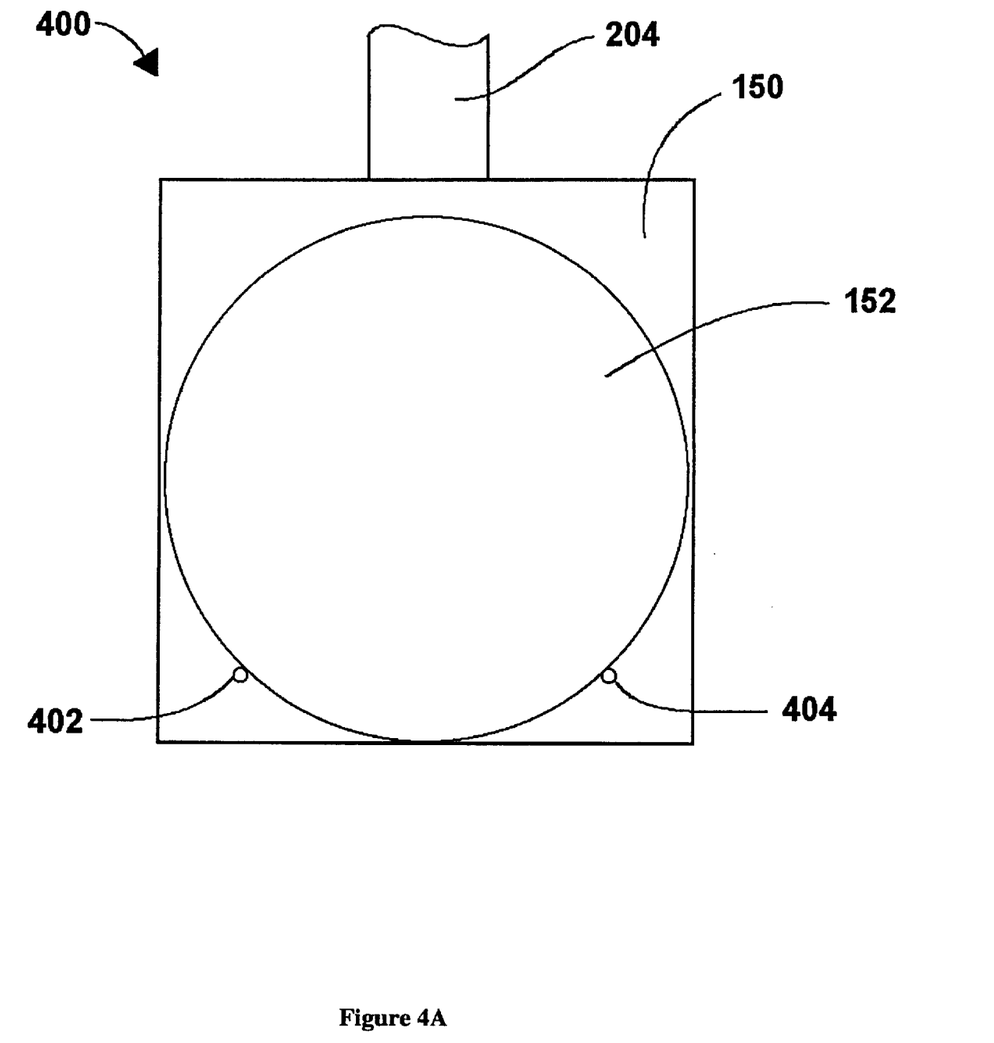
FIG. 4A is a normal view of the workpiece holder of the present invention, with a workpiece in place.

FIG. 4A is a normal view 400 of the workpiece holder 150 of the present invention, with a workpiece 152 in place. The workpiece holder 150 may use electrostatic attraction (an electrostatic chuck) to retain the workpiece 152 or may use gravity or a clamp or other arrangement to hold the workpiece in position on the workpiece holder 150. A first retaining pin 402 and a second retaining pin 404 may optionally be used to help retain the workpiece 152 on the workpiece holder.

Figure 4B:
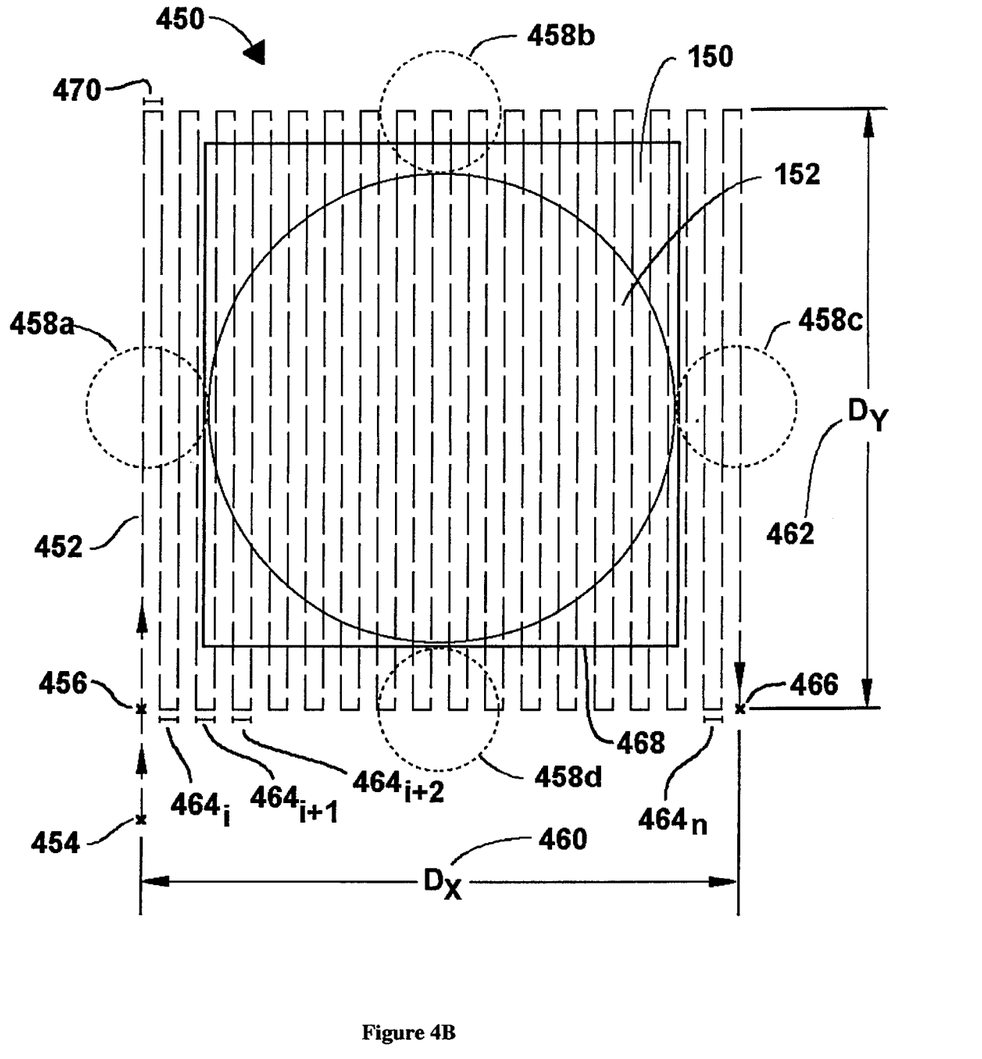
FIG. 4B is a normal view of the workpiece holder of the present invention showing the relationship of a GCIB scanning pattern relative to workpiece holder and workpiece.

FIG. 4B is a normal view 450 of the workpiece holder 150 of the present invention showing the relationship of a GCIB 128 (as shown in FIGS. 2 and 3) scan path 452 (indicated by dotted serpentine path) relative to workpiece holder 150 and to a workpiece 152. For purposes of this figure and this discussion it has been assumed that the angle of beam incidence 206 as defined in FIG. 2 is 90 degrees, however the invention is not limited to 90 degrees angle of beam incidence 206. The workpiece holder 150 has a bottom edge 468. The scan path 452 represents the path that the center of the GCIB takes shown relative to the workpiece holder 150 and workpiece 152 as the workpiece holder is mechanically scanned through the GCIB 128 by X-scan actuator 202 and Y-scan actuator 204 (both as shown in FIGS. 2 and 3) during GCIB processing of the workpiece. A preliminary position 454 represents the position of the center of GCIB 128 prior to commencing processing. Start position 456 represents the position of the center of GCIB 128 at the commencement of controlled processing. Finish position 466 represents the position of the center of GCIB 128 at the finish or end of processing. Preliminary position 454 may be distinct from start position 456, as shown in FIG. 4B, or the start position 456 may serve as the preliminary position. Dotted circles 458a, 458b, 458c, and 458d represent the envelope of the projection of the GCIB envelope (known as the beam spot) on the plane of the front surface of the workpiece holder 150. The GCIB 128 completely over-scans the workpiece 152 on all sides. Along the bottom edge 468 of the workpiece holder 150, the GCIB 128 also completely over-scans the bottom edge 468 of the workpiece holder 150. Between the start position 456 and the finish position 466, the scan path 452 covers a scanned area, $A_S = D_X \times D_Y$, where $D_X$ and $D_Y$ are indicated by the designators 460 and 462 respectively. Between the start position 456 and the finish position 466, the scan path 452 of the center of the GCIB 128 makes a predetermined number, N, passes across the workpiece holder 150 in the Y-axis direction. Each of the N passes is of length 462 ($D_Y$). In FIG. 4B, N is shown to be 34 passes for example only, not for limitation. The value of N is not particularly critical and may be chosen to provide adequate overlap of successive scan passes to result in an acceptable degree of uniformity of processing by the GCIB. In general, smaller beam diameters and larger workpieces require larger values of N to provide good processing uniformity. At the Y-position extremes of each of the N passes of the scan path 452, the path moves (relative to the workpiece holder 150)

in the X-axis direction by an X-axis distance increment 470 $I_X$, where $I_X=D_X/(N-1)$, where $D_X$ is the length 460.

The Y-direction scan speed, $V_Y$, is controlled to be substantially constant during each of the N passes in the Y-axis direction. Accordingly, the time per scan pass in the Y-axis direction has a constant value $T_Y$ and the total time of the N Y-direction scans is $T_S=N\times T_Y$, and the Y-scan motion speed is given by $V_Y=(N\times D_Y)/T_S$. At the Y-position extremes near the bottom edge 468 of the workpiece holder 150, of each of the N passes of the scan path 452, the scan path makes X-axis distance increments 464$_i$, 464$_{i+1}$, 464$_{i+2}$, ... 464$_n$, where n=(N/2)−1. The X-direction scan speed, $V_X$, in the direction of the X-motion increments is not particularly important and is chosen for design simplicity, since the GCIB 128 is always off of the workpiece 152 during the X-scan motions because of the over-scan. At all of the times when the center of the GCIB 128 is at preliminary position 454, or at start position 456, or at finish position 466, or at any of the X-axis distance increments 464 near the bottom edge 468 of workpiece holder 150, the entire beam spot of GCIB 128 is scanned beyond the bottom edge 468 of workpiece holder 150 and the GCIB 128 passes downstream of the workpiece holder 150 and enters the Faraday cup 306 (as shown in FIG. 3). At such times, the Faraday cup 306 collects sensor current 342, $I_S$, for measurement. At any of those such times, sensor current 342, $I_S$, may be used for measuring the GCIB 128 beam current, $I_B$, or the total current, $I_T$, (including electrons) available for charging the workpiece, depending on the "D" or "C" position selection of switches 320 and 322 as shown in FIG. 3 and described above. Although complete overscan of the workpiece 152 on all sides is the preferred embodiment for achieving uniform processing of the entire workpiece 152, it is recognized that to it is only necessary to overscan the workpiece 152 and workpiece holder 150 in at least one location to practice the present invention. For purposes of explanation, the scan path 452 has been shown as a serpentine path, with beam travel in X-scan and Y-scan directions and describing an overall rectangularly shaped scanned area $A_S$. It is recognized that the invention is not limited to the above-described scan path 452. Other two-axis scan paths describing scan patterns of area $A_S$ generated by constant or varying velocities in the two axes and producing rectangular or non-rectangular scanned area, even including spiral patterns may be utilized provided that the pattern includes at least one complete overscan such that the entire beam spot of GCIB 128 is scanned beyond an edge of the workpiece holder 150 and enters the Faraday cup 306 for measurement.

Figure 5:
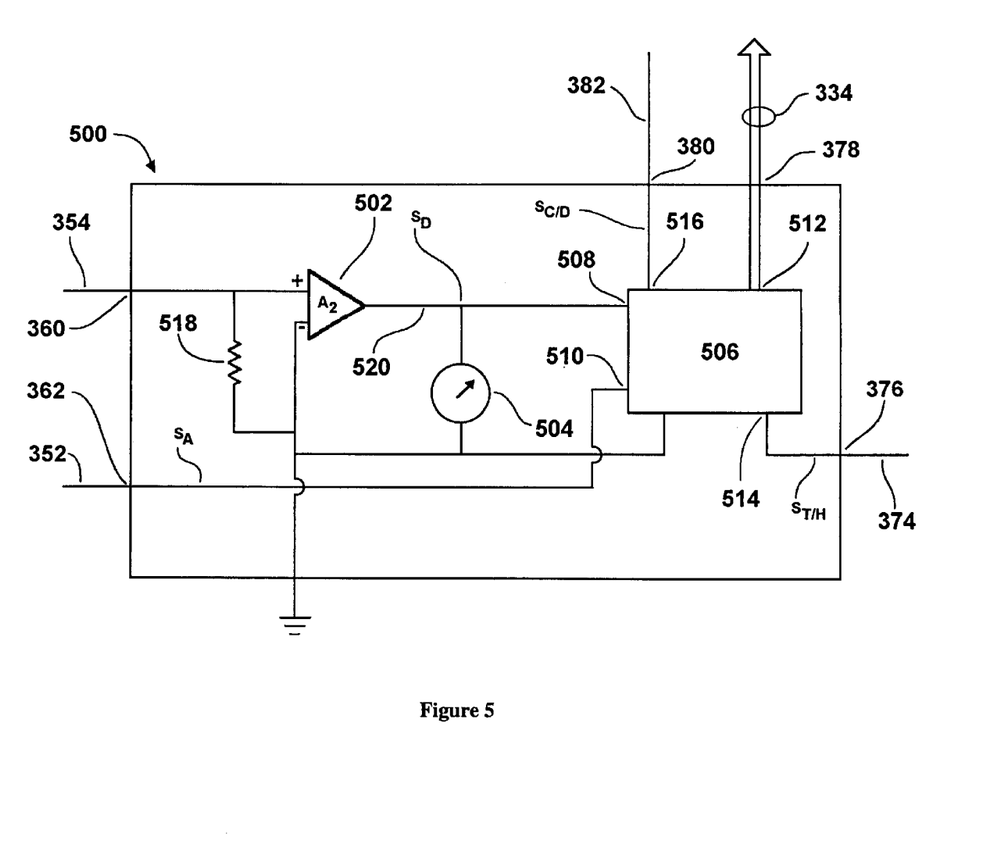
FIG. 5 represents a schematic of details of the dosimetry and scanning control portions of the present invention.

FIG. 5 represents a schematic of details of the dosimetry and scanning control system 500 of FIG. 3. Referring to FIG. 5, dosimetry and scanner control system 500 has a sensing input 360 for receiving sensor current 342, $I_S$, on lead 354. During dosimetry measurements, when switches 320 and 322 are set to their respective "D" positions, $I_S$ is a measure of the GCIB 128 current, $I_B$. Sensor current 342 ($I_S$) is connected through lead 354 to resistor 518 as well as to non-inverting input of amplifier 502. Resistor 518 may have a value of 1 Megohm, for example, not for limitation. Amplifier 502 has a high input-impedance non-inverting input and amplifies the voltage drop across resistor 518 due to sensor current 342 ($I_S=I_B$) flowing to ground through resistor 518. Amplifier 502 has a gain $A_2$ and outputs dosimetry signal $S_D$ proportional to the beam current, $I_B$, of GCIB 128. Lead 520 connects dosimetry signal $S_D$ to the dosimetry input 508 of dosimetry/scan controller 506 and also to indicator device 504. Indicator device 504 indicates the magnitude of the beam current, $I_B$, of GCIB 128.

Dosimetry/scan controller 506 has an alarm input 510 for receiving alarm signal, $S_A$, on lead 352 through alarm signal input 362 of dosimetry and scanner control system 500.

Dosimetry/scan controller 506 has a track/hold signal output 514 for outputting a track/hold signal, $S_{T/H}$, on lead 374 through track/hold command output 376 of dosimetry and scanner control system 500.

Dosimetry/scan controller 506 has a C/D switch control output 516 for outputting a C/D switch control signal, $S_{C/D}$, on lead 382 through switch control output 380 of dosimetry and scanner control system 500.

Dosimetry/scan controller 506 has a scanner control output bus 512 for outputting scanner control signals on cable 334 through scanner control outputs 378 of dosimetry and scanner control system 500.

It is recognized that dosimetry/scan controller 506 may optionally be a shared part of the functionality and apparatus of a microprocessor system or microcomputer or general purpose controller that also controls other functions of the GCIB processing system 300.

In operation, prior to initiation of GCIB processing of a workpiece 152, a GCIB 128 is established in GCIB processing system 300, with workpiece holder 150 positioned in preliminary position 454. Accordingly, GCIB 128 passes into Faraday cup 306. Dosimetry/scan controller 506 outputs a signal, $S_{C/D}$ to cause switch controller 324 to set switches 320 and 322 to the charging measurement position "C". Then dosimetry/scan controller 506 outputs a track/hold signal, $S_{T/H}$, to cause the track/hold output 368 of track-hold module 364 to track charging signal $S_C$. Accordingly, indicator device 356 and neutralizer power supply 346 receive $S_{CH}$, which tracks $S_C$. A negative feedback loop is closed through the emission of thermoelectrons 336. Sensor current 342, $I_S$, is minimized by the feedback. If the system is functioning properly, charging signal $S_C$ is minimized and charge alarm system 350 does not output an alarm or alarm signal $S_A$. After a time delay adequate to permit settling of the $S_C$ signal (typically a second to a few seconds), dosimetry/scan controller 506 tests alarm signal $S_A$ at alarm input 510 to assure that the total current available to charge the workpiece 152 is at a safe level. When dosimetry/scan controller 506 has determined that there is no alarm signal $S_A$, it outputs a track/hold signal, $S_{T/H}$, to cause the track/hold output 368 of track-hold module 364 to hold the charging track/hold signal, $S_{CH}$, fixed for the duration of the GCIB processing of the workpiece 152.

Dosimetry/scan controller 506 next outputs a signal, $S_{C/D}$ to cause switch controller 324 to set switches 320 and 322 to the dosimetry position "D". Accordingly, dosimetry input 508 of dosimetry/scan controller 506 receives dosimetry signal $S_D$. Dosimetry/scan controller measures the value of dosimetry signal $S_D$ (in amps of beam current, $I_B$, typically a few microamps to a few thousand microamps). Dosimetry/scan controller 506 has a previously stored, predetermined, required processing dose, $D_P$, (measured in amp-seconds per unit area) for GCIB processing of the workpiece 152 to achieve the desired processing effect. Other process parameters including the number of scan passes, N, X- and Y-scan distances $D_X$ and $D_Y$ are also predetermined and previously stored in dosimetry/scan controller 506. Dosimetry/scan controller 506 calculates total scan time $T_S$ and scan speed $V_Y$ according to:

$$A_S=D_X\times D_Y$$

$$T_S=(D_P\times A_S)/I_B$$

$$V_Y=(N\times D_Y)/T_S$$

Dosimetry/scan controller 506 then sends signals through scanner control output bus 512 through scanner control outputs 378 through cable 334 to cause X-scan actuator 202 and Y-scan actuator 204 to produce controlled X-scan motions and Y-scan motions with controlled speeds, first from preliminary position 454 to start position 456, then along scan path 452 to finish position 466. Each Y-scan motion is performed at a controlled Y-scan speed $V_Y$. The scan path 452 (see FIG. 4B) is generated. When the finish position 466 has been achieved, the processing of the workpiece 152 is complete and processing dose $D_P$ has been applied uniformly to the entire workpiece 152, and with minimized charging of the workpiece 152.

Although the invention has been described with respect to various embodiments, it should be realized that this invention is also capable of a wide variety of further and other embodiments within the spirit and scope of the appended claims.

What is claimed is:

1. An apparatus utilizing a gas cluster ion beam for processing a surface of a workpiece, the apparatus comprising:
    a vacuum vessel;
    a gas cluster ion beam source within the vacuum vessel for producing a gas cluster ion beam having a beam current;
    an accelerator for accelerating the gas cluster ion beam along a trajectory;
    workpiece holding means for holding the workpiece for gas cluster ion beam processing;
    controllable moving means for selectively scanning said workpiece holding means and the workpiece through said gas cluster ion beam at a location along said trajectory, between said accelerator and said current measurement means, and for selectively removing the workpiece holding means and the workpiece from said gas cluster ion beam trajectory;
    control means for providing signals to said controllable moving means for scanning the workpiece and for removing the workpiece and workpiece holder from said gas cluster ion beam trajectory to allow measurement of said beam current; and
    current measurement means disposed along said trajectory for measuring current, said current measuring means having at least two controllable modes, one of said modes selectively measuring a sample of the gas cluster ion beam current and another of said modes selectively measuring a sample of the total current available for charging the workpiece, said control means providing control signals for selecting between the two modes.

2. The apparatus of claim 1, wherein the current measurement means provides at least one beam current measurement signal to said control means, said at least one beam current measurement signal representing a sample of said gas cluster ion beam current measured while the workpiece and said workpiece holder are removed from said gas cluster ion beam trajectory.

3. The apparatus of claim 2, wherein said control means uses the at least one beam current measurement signal representing a sample of said gas cluster ion beam current to control the scanning of the workpiece.

4. The apparatus of claim 2, wherein said control means uses the at least one beam current measurement signal representing a sample of said gas cluster ion beam current to control a dosage of said gas cluster ion beam applied to the workpiece during processing.

5. The apparatus of claim 1, further comprising a controllable neutralizer for providing electrons to reduce space charge in said gas cluster ion beam.

6. The apparatus of claim 1, wherein said control means measures at least one sample of said total current available and uses said at least one measured sample of total current available to control said controllable neutralizer to reduce the total current available for said electrical charging of the workpiece to a predetermined safe level for processing.

7. The apparatus of claim 1, wherein said control means measures at least one sample of said total current available and uses said at least one measured sample of total current available to prevent processing of the workpiece if said total current exceeds a predetermined safe level for said processing.

8. The apparatus of claim 6, wherein said control means further measures at least one sample of said gas cluster ion beam current and uses the measurement of the at least one sample of said gas cluster ion beam current to control the scanning of the workpiece.

9. A method of processing the surface of a workpiece using a gas cluster ion beam comprising the steps of:
    forming a gas cluster ion beam within a vacuum vessel, said gas cluster ion beam having a gas cluster ion beam current;
    accelerating said gas cluster ion beam along a trajectory;
    controllably holding the workpiece for gas cluster ion beam processing out of the trajectory of said gas cluster ion beam;
    providing a current measurement means having at least two controllable modes, one of said modes for selectively measuring a sample of the gas cluster ion beam current and another of said modes selectively measuring a sample of the total current available for charging the workpiece;
    selecting said mode for measuring a sample of the gas cluster ion beam current;
    measuring, at least once, a sample of the gas cluster ion beam current;
    moving, at least once, the workpiece into the trajectory of said gas cluster ion beam for processing; and
    using said at least one measurement of a sample of the gas cluster ion beam current to control a dosage of said gas cluster ion beam applied to the workpiece during said processing.

10. A method of processing the surface of a workpiece using a gas cluster ion beam comprising the steps of:
    forming a gas cluster ion beam within a vacuum vessel, said gas cluster ion beam having a gas cluster ion beam current;
    accelerating said gas cluster ion beam along a trajectory;
    controllably holding the workpiece for gas cluster ion beam processing out of the trajectory of said gas cluster ion beam;
    providing a current measurement means having at least two controllable modes, one of said modes for selectively measuring a sample of the gas cluster ion beam current and another of said modes selectively measuring a sample of the total current available for charging the workpiece;
    selecting said mode for measuring a sample of the total current;
    measuring a sample of total current available for workpiece charging;
    using said sample of said total current available as a basis for reducing said total current available for workpiece charging to a predetermined safe level; and moving the workpiece into the trajectory of said gas cluster ion beam for processing.

11. A method of processing the surface of a workpiece using a gas cluster ion beam comprising the steps of:

forming a gas cluster ion beam within a vacuum vessel, said gas cluster ion beam having a gas cluster ion beam current;

accelerating said gas cluster ion beam along a trajectory;

controllably holding the workpiece for gas cluster ion beam processing out of the trajectory of said gas cluster ion beam;

providing a current measurement means having at least two controllable modes, one of said modes for selectively measuring a sample of the gas cluster ion beam current and another of said modes selectively measuring a sample of the total current available for charging the workpiece;

selecting said mode for measuring a sample of the total current;

measuring a sample of total current available for workpiece charging;

using said sample of said total current available as a basis for reducing said total current available for workpiece charging to a predetermined safe level;

selecting said mode for measuring a sample of the gas cluster ion beam current;

measuring, at least once, a sample of the gas cluster ion beam current;

moving, at least once, the workpiece into the trajectory of said gas cluster ion beam for processing; and using said at least one measurement of a sample of the gas cluster ion beam current to control a dosage of said gas cluster ion beam applied to the workpiece during processing.

12. The apparatus of claim 1, further comprising a controllable neutralizer for providing electrons to reduce electrical charging of the workpiece.

13. The apparatus of claim 6, wherein said control means further measures at least one sample of said gas cluster ion beam current and uses the measurement of the at least one sample of said gas cluster ion beam current to control a dosage of said gas cluster ion beam applied to the workpiece.

* * * * *